(12) United States Patent
Mickevicius (10) Patent No.: US 12,298,371 B2
(45) Date of Patent: May 13, 2025

(54) SIMULTANEOUS MULTI-ORIENTATION MAGNETIC RESONANCE IMAGING

(71) Applicant: The Medical College of Wisconsin, Inc., Milwaukee, WI (US)

(72) Inventor: Nikolai Jonas Mickevicius, Mukwonago, WI (US)

(73) Assignee: The Medical College of Wisconsin, Inc., Milwaukee, WI (US)

( * ) Notice: Subject to any disclaimer, the term of this patent is extended or adjusted under 35 U.S.C. 154(b) by 0 days.

(21) Appl. No.: 17/634,774

(22) PCT Filed: Aug. 12, 2020

(86) PCT No.: PCT/US2020/045973
§ 371 (c)(1),
(2) Date: Feb. 11, 2022

(87) PCT Pub. No.: WO2021/030466
PCT Pub. Date: Feb. 18, 2021

(65) Prior Publication Data
US 2022/0283251 A1 Sep. 8, 2022

Related U.S. Application Data

(60) Provisional application No. 62/885,467, filed on Aug. 12, 2019.

(51) Int. Cl.
*G01V 3/00* (2006.01)
*G01R 33/483* (2006.01)
*G01R 33/561* (2006.01)

(52) U.S. Cl.
CPC ....... *G01R 33/483* (2013.01); *G01R 33/5615* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 4,871,966 A 3/1989 Smith et al.
5,374,889 A * 12/1994 Leach .................... G01R 33/56
324/309

(Continued)

FOREIGN PATENT DOCUMENTS

JP 6422700 B2 * 11/2018 ......... G01R 33/3664
WO WO-2017173437 A1 * 10/2017 ......... G01R 33/4808

OTHER PUBLICATIONS

Choi KR 101837689 B1 (Year: 2018).*
(Continued)

*Primary Examiner* — Walter L Lindsay, Jr.
*Assistant Examiner* — Frederick Wenderoth
(74) *Attorney, Agent, or Firm* — Quarles & Brady LLP (57) ABSTRACT

Simultaneous multi-orientation ("SMO") magnetic resonance imaging ("MRI"), in which arbitrarily-oriented slices are simultaneously imaged, is described. The SMO techniques can include any number of pulse sequences that are adapted to acquire data from two or more arbitrarily oriented slices. In general, an SMO acquisition includes sequentially exciting two or more arbitrarily rotated slices that share a common spatial encoding axis (e.g., a common frequency encoding direction) and simultaneously acquiring data from the excited slices.

14 Claims, 4 Drawing Sheets

(58) Field of Classification Search
USPC .......................................................... 324/309
See application file for complete search history.

(56) References Cited

U.S. PATENT DOCUMENTS

| | | |
|---|---|---|
| 2017/0261584 A1 | 9/2017 | Bioprotonics |
| 2018/0067176 A1 | 3/2018 | Minnesota |
| 2018/0092569 A1 | 4/2018 | Shanghai |
| 2019/0113587 A1 | 4/2019 | The |

OTHER PUBLICATIONS

Kubo, Toshikazu, et al. "Radial-sequence magnetic resonance imaging in evaluation of acetabular labrum." Journal of orthopaedic science 4 (1999): 328-332.

Mickevicius, Nikolai J., et al. "Simultaneous motion monitoring and truth-in-delivery analysis imaging framework for MR-guided radiotherapy." Physics in Medicine & Biology 63.23 (2018): 235014; pp. 1-26.

Mickevicius, Nikolai J., et al. "Generalized simultaneous multi-orientation 2D imaging." Magnetic Resonance in Medicine 84.2 (2020): 847-856.

Mickevicius, Nikolai J., et al. "Application of a k-Space Interpolating Artificial Neural Network to In-Plane Accelerated Simultaneous Multislice Imaging." arXiv preprint arXiv:1902.08589 (2019). p. 1-22.

PCT International Search Report, PCT/US20120/045973, mailed on Oct. 30, 2020, 2 pages.

PCT Written Opinion of the ISA, PCT/US20120/045973, mailed on Oct. 30, 2020, 10 pages.

\* cited by examiner

SIMULTANEOUS MULTI-ORIENTATION MAGNETIC RESONANCE IMAGING

CROSS-REFERENCE TO RELATED APPLICATIONS

This application represents the national stage entry of PCT/US2020/045973 filed on Aug. 12, 2020 and claims the benefit of U.S. Provisional Patent Application Ser. No. 62/885,467, filed on Aug. 12, 2019, and entitled "SIMULTANEOUS MULTI-ORIENTATION MAGNETIC RESONANCE IMAGING," the contents of which is herein incorporated by reference in its entirety.

BACKGROUND

The non-invasive treatment of diseases with radiation therapy often offers improvements in healthcare outcome when used instead of, or in conjunction with, surgical alternatives. Unfortunately, along with the advantages of non-invasive therapy come large uncertainties in the position of the target relative to the distribution of the planned dose. Medical imaging plays a significant role in improving the precision of these therapies. In external beam radiation therapy, for example, the current standard of care involves imaging the patient with on-board cone beam computed tomography ("CT") with non-diagnostic quality, and aligning it to a higher quality CT on which the radiation dose plan was generated. This rough alignment of the patients' anatomy of the day allows for the re-optimization of treatment plans to maximize dose to the target while minimizing dose to nearby healthy tissues.

It is possible for the patients' alignment to deviate from the planned dose distribution while it is being delivered. This misalignment occurs frequently during radiation therapy of abdominal or thoracic tumors. Respiratory motion, organ filling, and bulk motion of the patient due to muscle relaxation or anxiety occurring within a treatment fraction all have the potential to affect the outcome. Common methods to manage this nuisance motion include gating based on external surrogates for respiratory motion, planar real-time x-ray imaging, implanted radiofrequency transponders, and ultrasound imaging. While such techniques have been proven to be functional, each suffers from its own disadvantage. One such disadvantage, for example, is that motion surrogate signals do not always reflect true tumor motion. The emergence of MRI-guided radiation therapy ("MR-gRT") with integrated imaging and therapy systems affords a more robust solution to large intrafraction motions.

Rapid two-dimensional "cine" imaging with a high frame rate is often employed during MR-gRT for patients exhibiting significant anatomical displacement during respiration. With the high soft tissue contrast in these images, the target can be segmented in real-time. Subsequently, if the target leaves a predefined margin, the beam can be switched off to minimize the risk of toxicity to healthy tissues. The issue with imaging only in a single 2D plane, however, is that out-of-plane motion of the target is difficult to detect. Thus, some MR-gRT vendors and research groups have proposed the use of interleaved cine imaging in two orthogonal planes to obtain a pseudo-3D estimate of the target motion while maintaining a reasonable frame rate.

SUMMARY OF THE DISCLOSURE

The present disclosure addresses the aforementioned drawbacks by providing a method for imaging a subject using a magnetic resonance imaging ("MRI") system. A pulse sequence is performed with the MRI system, wherein the pulse sequence includes in each repetition time ("TR") period: a first radio frequency ("RF") excitation pulse that excites spins in a first slice; a first set of spatial encoding gradients to provide slice encoding and phase encoding of the spins in the first slice; a second RF excitation pulse that excites spins in a second slice that is non-orthogonal to the first slice; a second set of spatial encoding gradients to provide slice encoding and phase encoding of the spins in the second slice; and a frequency encoding gradient that forms a first echo signal at a first echo time and a second echo signal at a second echo time. The first echo signal is associated with spins in the first slice and the second echo signal is associated with spins in the second slice. First data are acquired from the first echo signal with the MRI system, the first data being associated with the first slice, and second data are acquired from the second echo signal with the MRI system, the second data being associated with the second slice.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are systems and methods for simultaneous multi-orientation ("SMO") magnetic resonance imaging ("MRI"), in which arbitrarily-oriented slices are simultaneously imaged. The SMO techniques described in the present disclosure can include any number of pulse sequences that are adapted to acquire data from two or more arbitrarily oriented slices. Such implementations allow for rapidly imaging a moving target in two or more different planes, simultaneously. Using this imaging technique, more spatial information about the object being image can be obtained in a single acquisition. The improved visualization of the target and nearby structures can also be used to aid in the monitoring of intrafraction motion and to improve the accuracy of dose delivery in MRI-guided radiation therapy.

As will be described, it is an advantage of the systems and methods described in the present disclosure to improve temporal resolution (e.g., increase cine imaging frame rate) while keeping the number of slices the same relative to conventional interleaved-slice imaging techniques.

Figure 1:
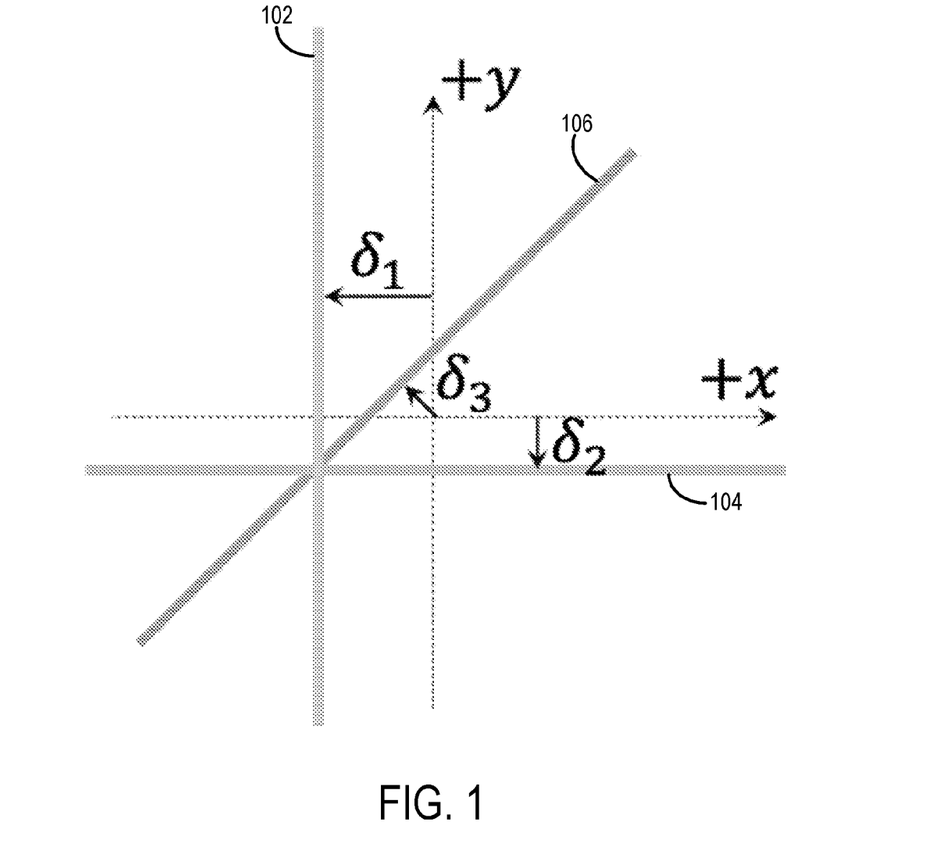
FIG. 1 shows an example of a simultaneous multi-orientation ("SMO") slice prescription. Each slice shares a common frequency encoding axis.

In general, an SMO acquisition includes sequentially exciting N arbitrarily rotated slices that share a common spatial encoding axis (e.g., a common frequency encoding direction) and simultaneously acquiring data from the excited slices. For example, as shown in FIG. 1, three different arbitrarily oriented slices (first slice 102; second slice 104; and third slice 106) can be excited and data from these slices can be acquired in each repetition of a pulse sequence (e.g., in each repetition time ("TR") period). Thus, in an SMO acquisition at least two slices excited in each TR period will be non-orthogonal to each other. In this way, these non-orthogonal slices may be rotated relative to each other about the common spatial encoding axis by an angle other than 0 degrees, 90 degrees, 180 degrees, 270 degrees, or multiples thereof.

Each slice begins accruing phase due to the application of gradients at the isocenter of its radio frequency ("RF") excitation pulse, $T_{ISO,n}$, where n=1, 2, ..., N represents the index to the nth slice to be excited. Simultaneously encoding arbitrarily oriented slices involves balancing the zeroth gradient moment, $M_{0,n}(t)$, for all slices. The zeroth moment is the integral of the time-dependent gradient vector, G(t), beginning from $T_{ISO,n}$, $$M_{0,n}(t) = \int_{T_{ISO,n}}^{T_{ISO,n}+t} G(t')dt'. \tag{1}$$

The coordinates in which the gradient moment can be referenced includes those of the physical gradient coils themselves (i.e., x, y, and z), or logical coordinates corresponding to the different spatial encoding dimensions used in MRI (e.g., phase encoding (P), frequency encoding (F), and slice-select (S) dimensions). Although the pulse sequences described in the present disclosure implement Cartesian sampling of k-space, SMO pulse sequences can also be adapted for radial or spiral readout trajectories. The conversion between logical and physical coordinates can be performed by multiplication with an orthogonal rotation matrix for each slice, $R_n$, $$\begin{bmatrix} M_{0,n,x} \\ M_{0,n,y} \\ M_{0,n,z} \end{bmatrix} = R_n \begin{bmatrix} M_{0,n,P} \\ M_{0,n,F} \\ M_{0,n,S} \end{bmatrix}. \tag{2}$$

The rotation matrices can be calculated by vendor-specific scanner coordinates, patient orientation, slice orientation, desired phase and frequency encoding dimensions, or combinations thereof. The hat accent will be used to denote vectors in physical coordinates while no accent denotes vectors in logical coordinates (e.g., $\hat{M}_{0,n}=R_n M_{0,n}$).

The zeroth gradient moment is related to k-space coordinates by the following relationship:

$$k_n = \gamma M_{0,n} \tag{3};$$

where $\gamma$ is the gyromagnetic ratio in Hz/T. The step size in k-space along the phase and frequency encoding dimensions is given, respectively, by, $$\Delta k_P = 1/FOV_P \tag{4};$$

$$\Delta k_F = 1/FOV_F \tag{5};$$

where FOV is the field-of-view along each direction (e.g., the phase encoding direction and the frequency encoding direction). The acquisition matrix dimensions for the phase and frequency encoding directions are given by $L_P$ and $L_F$ respectively. The index, $\ell = -L_P/2, \ldots, L_P/2$ references the phase encoding lines to be acquired.

By the echo time for each slice, $TE_n$, the zeroth gradient moment should be, $$M_{0,n}(TE_n)=[\ell \Delta k_P/\gamma\ 0\ 0]^T \tag{6}.$$

For each slice, the desired encoding moment, in logical coordinates, immediately prior to the start of the readout gradient is given by, $$E_{n,\ell} = \begin{bmatrix} \ell \Delta k_P/\gamma \\ M_{0,n,F} \\ 0 \end{bmatrix}. \tag{7}$$

The moment accumulated by the start of the readout gradient along the frequency encoding dimension, $M_{0,n,F}$, dependent on the SMO readout scheme. If an extended readout gradient (e.g. those in simultaneous image refocusing ("SIR") acquisitions) is employed, the slices can be acquired with equal TEs ("ETE") or non-equal TEs ("NETE").

In an ETE-SIR scheme, the gradient echoes for all slices are acquired in the order in which they were excited under separate portions of the same readout gradient. For NETE-SIR, the signal for all slices are acquired in the opposite order in which they were excited. If a SIR readout is not employed, the signals from all slices will be acquired in an aliased fashion, inherently with different echo times for each slice ("NETE-Aliased"). $M_{0,n,F}$ can be calculated as follows for each scheme:

$$M_{0,nF,ETE-SIR}=-(n-0.5)\cdot L_F\cdot(\Delta k_F/\gamma)-\delta M_{0,F} \tag{8};$$

$$M_{0,n,F,NETE-SIR}=-(N-n+0.5)\cdot L_F\cdot(\Delta k_F/\gamma)-\delta M_{0,F} \tag{9};$$

$$M_{0,n,F,NETE-Aliased}=-0.5\cdot L_F\cdot(\Delta k_F/\gamma)-\delta M_{0,F} \tag{10}.$$

Here, $\delta M_{0,F}$ is the area under the ramp-up portion of the readout gradient. With the ETE-SIR readout scheme, the slices will have equal echo times when the time between gradient echoes is equal to the time between the isocenters of consecutive RF pulses, $\Delta T_{RF}$. Therefore, the readout bandwidth, BW, should be set accordingly as, $$BW_{ETE} = \frac{L_F}{\Delta T_{RF}}. \tag{11}$$

In order to spatially encode multiple arbitrarily oriented slices in a single TR period, (e.g., based on the constraint in Eqn. (7)) for all slices a set of physical coordinate zeroth gradient moments played out immediately following the nth slice-selection gradient, $\hat{\beta}_{n,\ell}$, are designed and implemented. These gradient moments, $\hat{\beta}_{n,\ell}$, can be referred to as multiple orientation encoding moments. Because the nth slice accumulates phase due to all gradients played out after $T_{ISO,n}$, the following equation describes the relationship between the desired encoding moment and the $\hat{\beta}_{n,\ell}$ moment to be calculated:

$$\begin{bmatrix} R_1 E_{1,\ell} \\ R_2 E_{2,\ell} \\ \vdots \\ R_N E_{N,\ell} \end{bmatrix} - \begin{bmatrix} f_1 I & I & \cdots & I \\ & f_2 I & \cdots & I \\ & & \ddots & \vdots \\ 0 & & & f_N I \end{bmatrix} \begin{bmatrix} R_1 \alpha_1 \\ R_2 \alpha_2 \\ \vdots \\ R_N \alpha_N \end{bmatrix} = \begin{bmatrix} I & I & \cdots & I \\ & I & \cdots & I \\ & & \ddots & \vdots \\ 0 & & & I \end{bmatrix} \begin{bmatrix} \hat{\beta}_{1,\ell} \\ \hat{\beta}_{2,\ell} \\ \vdots \\ \hat{\beta}_{N,\ell} \end{bmatrix}. \tag{12}$$

Here, I is the 3×3 identity matrix, $\alpha_n$ is a logical coordinate vector containing the total area under the nth slice-select gradient (i.e., $\alpha_n=[00A_{S,n}]^T$), and $f_n$ is the fraction of the total zeroth gradient moment for the nth slice-select gradient occurring after $T_{ISO,n}$. If Eqn. (12) is rewritten as Y=AB, then a solution for the $\hat{\beta}_{n,\ell}$ moments can be obtained via, $$B=(A^TA)^{-1}A^TY \quad (13);$$

or by recursively starting with n=N and substituting backward toward n=1.

In embodiments where spoiler gradients are implemented (e.g., in spoiled steady-state free precession ("SSFP") pulse sequences), a constant spoiling gradient moment may be desired within every TR period help to remove transverse magnetization coherences and eliminate spatially-dependent spoiling. The spoiling moments, $S_n=[S_{n,P}S_{n,F}S_{n,S}]^T$, are the total zeroth moments accumulated between TR periods. These moments need not be equal for all slices. They only need to be constant within each TR and have a magnitude, $|S_n|=\sqrt{S_{n,P}^2+S_{n,F}^2+S_{n,S}^2}$, that is large enough to sufficiently dephase the transverse magnetization. As one non-limiting example, the following condition in Eqn. (14) can fulfilled by introducing end-of-TR gradients with physical zeroth moment of $\hat{\Omega}_\ell$:

$$M_{0,n}(T_{ISO,n}+TR)=S_n \quad (14).$$

The $\hat{\Omega}_\ell$ moments can be calculated to satisfy Eqn. (14) for the first slice (i.e., n=1). The logical slice and phase spoiling components for slices n≥2 remain relatively constant and close to zero such that the spoiling moment along the frequency encoding direction largely dominates the net spoiling area. The expression for the end-of-TR gradient moment in physical coordinates can therefore be written as, $$\hat{\Omega}_\ell = R_1S_1 - \hat{\beta}_{1,\ell} - \sum_{i=2}^{N}(R_i\alpha_i + \hat{\beta}_{i,\ell}). \quad (15)$$

Figure 2:
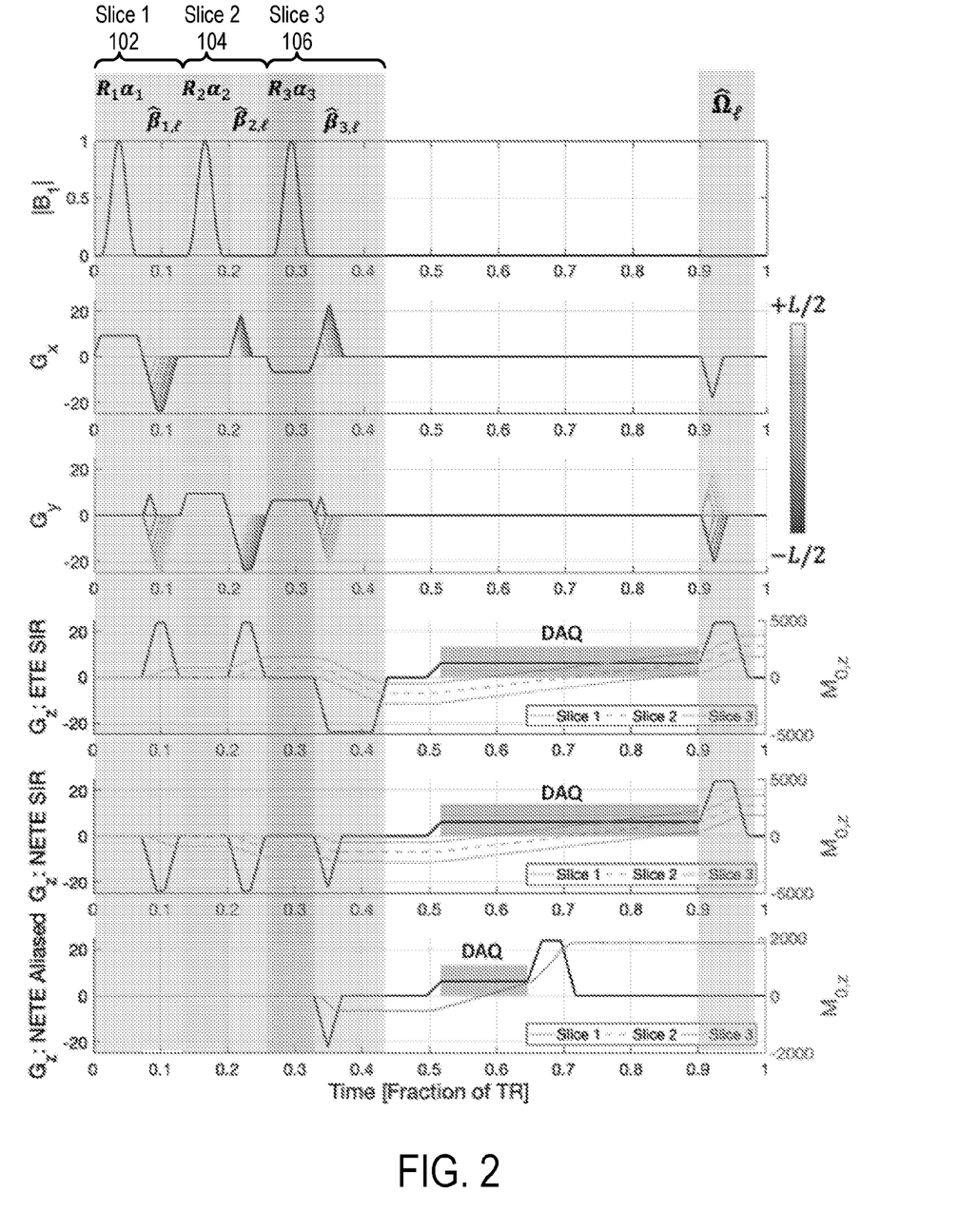
FIG. 2 shows an example SMO pulse sequence diagram.

An example pulse sequence timing diagram for SMO acquisitions with different frequency encoding schemes is shown in FIG. 2. In this example, three slices (e.g., the three slices shown in FIG. 1) are excited in each TR period. In these examples, gradients are applied immediately following each excitation pulse along the slice-select and phase encoding dimensions (e.g., x and y). These gradients are dependent on the current phase encoding line. The zeroth gradient moments used for spatially encoding the arbitrarily oriented slices, $\hat{\beta}_{n,\ell}$, are labeled above the pulse sequence timing diagram. As noted, three different frequency encoding, $G_z$, schemes are shown. In the SIR readouts, each slice is separately refocused under different portions of an extended readout gradient. In the aliased readout, the gradient echoes for all slices completely overlap. The echo times for each can be seen where the $M_{0,z}(t)$ plots for each slice reach a value of zero. In the ETE scheme, the echo times for all slices are equal. All slices have different echo times in the NETE schemes. The data acquisition ("DAQ") window is labeled on the plateau of the readout gradient. In this example, spoiler gradient moments, $\hat{\Omega}_\ell$ are also shown.

Figure 3:
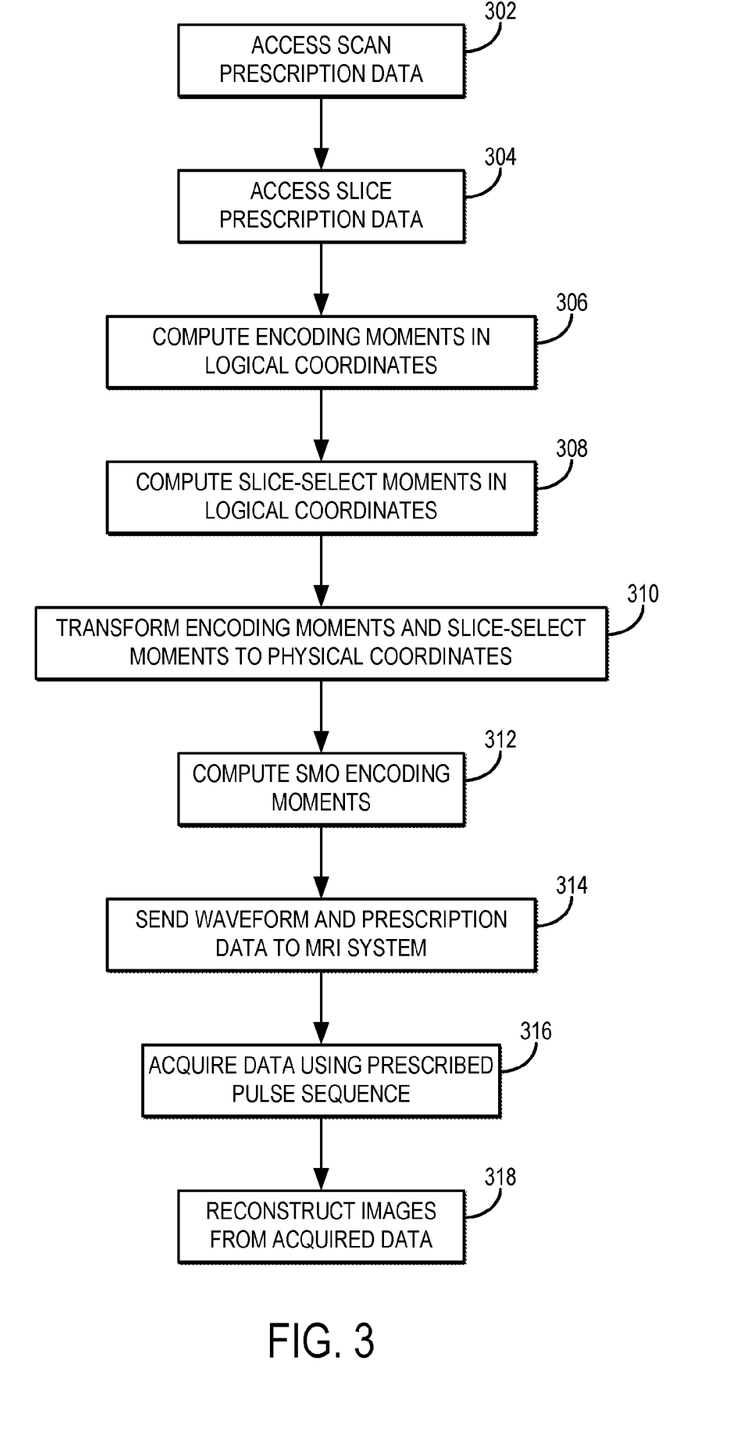
FIG. 3 is a flowchart setting forth the steps of an example method for designing and implementing an SMO pulse sequence.

Referring now to FIG. 3, a flowchart is illustrated as setting forth the steps of an example method for designing and implementing an SMO gradient encoding scheme for use in magnetic resonance imaging. The method includes accessing scan prescription data with a computer system, as indicated at step 302. Accessing the scan prescription data can include retrieving stored scan prescription data from a memory or other data storage device or medium. In other instances, accessing the scan prescription data can include communicating or otherwise transferring scan prescription data entered at the operator workstation of an MRI system by a user to the computer system, which in some instances may include the computer system such that scan prescription data are accessed by the computer system as the user enters the data.

The scan prescription data can include parameters such as the FOV in one or more dimensions, such as the FOV in the phase encoding dimension, $FOV_P$, and the FOV in the frequency encoding dimension, $FOV_F$; the number of slices, N, to be acquired in each TR period; and other parameters commonly established in a scan prescription, such as echo times, repetition time, image matrix, bandwidth, and so on.

Slice prescription data are also accessed with the computer system, as indicated at step 304. Like the scan prescription data, the slice prescription data can be accessed by retrieving stored slice prescription data from a memory or other data storage device or medium, or by communicating or otherwise transferring slice prescription data entered at the operator workstation of the MRI system by a user to the computer system.

The slice prescription data can include parameters and data such as the location and orientation for each of the multiple slices. As one non-limiting example, the orientation for each slice can be selected or otherwise determined based on a localizer scan that depicts the subject's anatomy.

In general, the slice prescription data defines at least a first slice and a second slice to be excited in each TR period, where this first slice and second slice are non-orthogonal to each other. In other implementations, the slice prescription data can define more than two slices to be excited in each TR period. In these instances, the slice prescription data define a plurality of slices, in which at least two of the slices are non-orthogonal to each other. Other slices in the plurality of slices may have any other arbitrary orientation. For example, the plurality of slices may include three slices, in which two slices are orthogonal to each other and the third slice is non-orthogonal to at least one of the other two slices. Such an example is illustrated in FIG. 1. Thus, in general, the plurality of slices may include some slices that are orthogonal to each other, some slices that are parallel to each other, or both, provided that at least two of the slices are non-orthogonal to each other.

Using the scan prescription data and the slice prescription data, the computer system computes or otherwise determined encoding moments in logical coordinates, $\mathbf{E}_{n,\ell}$, for each phase encoding line in each slice, as indicated at step 306. For instance, moments along the phase encoding dimension can be determined based on Eqn. (6), which is based on the phase encoding index, $\ell$, and phase encoding step, $\Delta k_P$, parameters contained in or otherwise derived from the scan prescription data. Moments along the frequency encoding dimension, $M_{0,n,F}$, can be computed based on the frequency encoding scheme prescribed in the scan prescription data. For example, the frequency encoding moments can be computed based on one of Eqns. (8)-(10), which are based on parameters in the scan prescription data, such as the frequency encoding step, $\Delta k_F$, frequency encoding size, $L_F$, and area under the readout gradient ramp, $\delta M_{0,F}$.

Using the scan prescription data and the slice prescription data, the computer system also computes or otherwise determined slice-select moments in logical coordinates, $\alpha_n$, for each slice, as indicated at step 308. For instance, the slice-select moments can be computed or otherwise determined based on the total area under the nth slice-select gradient. The slice-select moments can be weighted by the fraction, $f_n$, of the total zeroth gradient moment occurring after the isocenter of the related RF excitation pulse, $T_{ISO,n}$.

The encoding moments and the slice-select moments are then transformed from logical coordinates into physical coordinates, as indicated at step 310. For example, suitable rotation matrices, $R_n$, can be applied to each moment in order to transform the moments from logical coordinates to physical coordinates. Using the transformed encoding moments and slice-select moments, the desired SMO encoding moments, $\hat{\beta}_{n,s}$, are computed or otherwise determined for each phase encoding line in each slice, as indicated at step 312. These SMO encoding moments define gradients to be played out in order to spatially encode the multiple arbitrarily oriented slices. Thus, based on these SMO encoding moments, SMO encoding gradient waveforms are determined and provided to the MRI system (e.g., by communicating or otherwise transferring the SMO encoding gradient waveforms to the pulse sequence server of the MRI system) along with the other RF and gradient waveforms for the pulse sequence, as indicated at step 314.

As indicated at step 316, data can then be acquired from a subject using an MRI system that performs a pulse sequence that includes, among other things, SMO encoding gradients that have zeroth moments defined by the computed SMO encoding moments. From the acquired data, one or more images are then reconstructed, as indicated at step 318. The reconstructed images depict the subject in the multiple different arbitrarily oriented slices. In some implementations, the images can be reconstructed and displayed in real-time so as to provide visual feedback for treatment planning or guidance applications, such as may be useful in MR-guided radiation therapy. As an example, the images can be reconstructed using a reconstruction technique suitable for simultaneous multislice imaging. For instance, a scan-specific deep-learning based k-space interpolation techniques, such as Slice-RAKI described by N J Mickevicius, et al., in "Application of a k-Space Interpolating Artificial Neural Network to In-Plane Accelerated Simultaneous Multislice Imaging," arXiv e-prints 2019; arXiv: 1902.08589, can be used. In such implementations, the calibration data used to train the Slice-RAKI network can be acquired for each slice individually by switching off the RF pulses for the other slices in the SMO pulse sequence.

It is another aspect of the systems and methods described in the present disclosure that they can provide an improvement in temporal resolution that increases as a function of the number of slices to be imaged as compared to conventional interleaved-slice cine imaging. For example, if $L_P$ phase encode lines are desired for all slices, then the total acquisition time for a single frame of interleaved imaging will be equal to:

$$T_{ILV} = N \cdot L_P \cdot TR_{ILV} \qquad (16).$$

Using the methods described in the present disclosure, the acquisition time will be:

$$T_{SMO} = L_P \cdot TR_{SMO} \qquad (17).$$

When a fixed prescription geometry and pulse sequence constraints (e.g., minimum echo time, RF pulse duration, readout/slice bandwidths, maximum gradient slew rate, and maximum gradient amplitude) are considered, then the relative temporal acceleration factor that can be achieved with the methods described in the present disclosure is given by:

$$R_{T,N} = \frac{T_{ILV}}{T_{SMO}} = N \cdot \frac{TR_{ILV}}{TR_{SMO}}; \qquad (18)$$

where the TR values are the shortest possible repetition times for each case. Values of $R_{T,N} > 1$ represent an improvement in the achievable frame rate compared to interleaved imaging.

Figure 4:
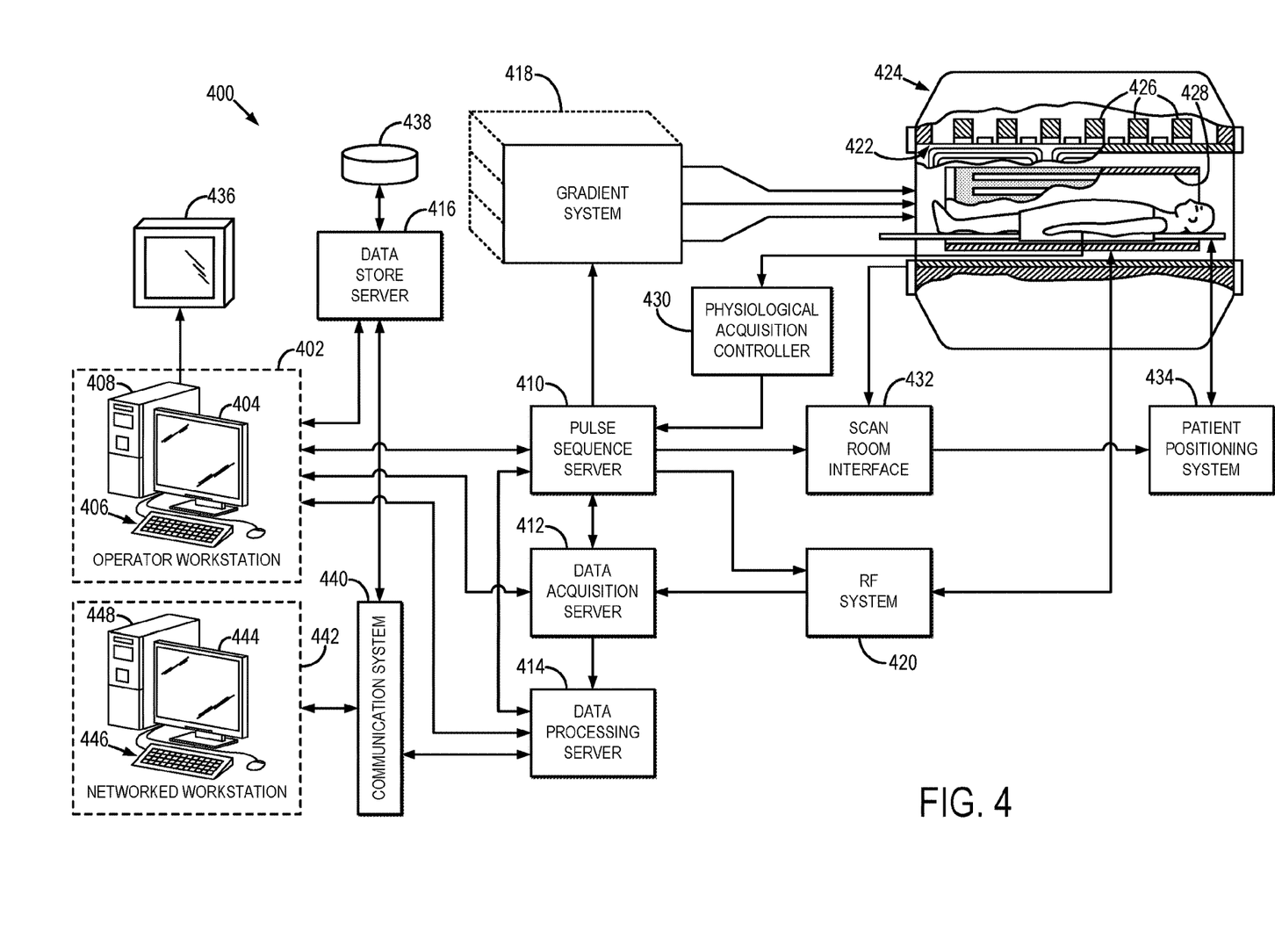
FIG. 4 is a block diagram of an example magnetic resonance imaging ("MRI") system that can implement one or more embodiments described in the present disclosure.

Referring particularly now to FIG. 4, an example of an MRI system 400 that can implement the methods described here is illustrated. The MRI system 400 includes an operator workstation 402 that may include a display 404, one or more input devices 406 (e.g., a keyboard, a mouse), and a processor 408. The processor 408 may include a commercially available programmable machine running a commercially available operating system. The operator workstation 402 provides an operator interface that facilitates entering scan parameters into the MRI system 400. The operator workstation 402 may be coupled to different servers, including, for example, a pulse sequence server 410, a data acquisition server 412, a data processing server 414, and a data store server 416. The operator workstation 402 and the servers 410, 412, 414, and 416 may be connected via a communication system 440, which may include wired or wireless network connections.

The pulse sequence server 410 functions in response to instructions provided by the operator workstation 402 to operate a gradient system 418 and a radiofrequency ("RF") system 420. Gradient waveforms for performing a prescribed scan are produced and applied to the gradient system 418, which then excites gradient coils in an assembly 422 to produce the magnetic field gradients $G_x$, $G_y$, and $G_z$ that are used for spatially encoding magnetic resonance signals. The gradient coil assembly 422 forms part of a magnet assembly 424 that includes a polarizing magnet 426 and a whole-body RF coil 428.

RF waveforms are applied by the RF system 420 to the RF coil 428, or a separate local coil to perform the prescribed magnetic resonance pulse sequence. Responsive magnetic resonance signals detected by the RF coil 428, or a separate local coil, are received by the RF system 420. The responsive magnetic resonance signals may be amplified, demodulated, filtered, and digitized under direction of commands produced by the pulse sequence server 410. The RF system 420 includes an RF transmitter for producing a wide variety of RF pulses used in MRI pulse sequences. The RF transmitter is responsive to the prescribed scan and direction from the pulse sequence server 410 to produce RF pulses of the desired frequency, phase, and pulse amplitude waveform. The generated RF pulses may be applied to the whole-body RF coil 428 or to one or more local coils or coil arrays.

The RF system 420 also includes one or more RF receiver channels. An RF receiver channel includes an RF preamplifier that amplifies the magnetic resonance signal received by the coil 428 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \qquad (19);$$

and the phase of the received magnetic resonance signal may also be determined according to the following relationship:

$$\varphi = \tan^{-1}\left(\frac{Q}{I}\right). \tag{20}$$

The pulse sequence server 410 may receive patient data from a physiological acquisition controller 430. By way of example, the physiological acquisition controller 430 may receive signals from a number of different sensors connected to the patient, including electrocardiograph ("ECG") signals from electrodes, or respiratory signals from a respiratory bellows or other respiratory monitoring devices. These signals may be used by the pulse sequence server 410 to synchronize, or "gate," the performance of the scan with the subject's heart beat or respiration.

The pulse sequence server 410 may also connect to a scan room interface circuit 432 that receives signals from various sensors associated with the condition of the patient and the magnet system. Through the scan room interface circuit 432, a patient positioning system 434 can receive commands to move the patient to desired positions during the scan.

The digitized magnetic resonance signal samples produced by the RF system 420 are received by the data acquisition server 412. The data acquisition server 412 operates in response to instructions downloaded from the operator workstation 402 to receive the real-time magnetic resonance data and provide buffer storage, so that data is not lost by data overrun. In some scans, the data acquisition server 412 passes the acquired magnetic resonance data to the data processor server 414. In scans that require information derived from acquired magnetic resonance data to control the further performance of the scan, the data acquisition server 412 may be programmed to produce such information and convey it to the pulse sequence server 410. For example, during pre-scans, magnetic resonance data may be acquired and used to calibrate the pulse sequence performed by the pulse sequence server 410. As another example, navigator signals may be acquired and used to adjust the operating parameters of the RF system 420 or the gradient system 418, or to control the view order in which k-space is sampled. In still another example, the data acquisition server 412 may also process magnetic resonance signals used to detect the arrival of a contrast agent in a magnetic resonance angiography ("MRA") scan. For example, the data acquisition server 412 may acquire magnetic resonance data and processes it in real-time to produce information that is used to control the scan.

The data processing server 414 receives magnetic resonance data from the data acquisition server 412 and processes the magnetic resonance data in accordance with instructions provided by the operator workstation 402. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 414 are conveyed back to the operator workstation 402 for storage. Real-time images may be stored in a data base memory cache, from which they may be output to operator display 402 or a display 436. Batch mode images or selected real time images may be stored in a host database on disc storage 438. When such images have been reconstructed and transferred to storage, the data processing server 414 may notify the data store server 416 on the operator workstation 402. The operator workstation 402 may be used by an operator to archive the images, produce films, or send the images via a network to other facilities.

The MRI system 400 may also include one or more networked workstations 442. For example, a networked workstation 442 may include a display 444, one or more input devices 446 (e.g., a keyboard, a mouse), and a processor 448. The networked workstation 442 may be located within the same facility as the operator workstation 402, or in a different facility, such as a different healthcare institution or clinic.

The networked workstation 442 may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may be exchanged between the data processing server 414 or the data store server 416 and the networked workstations 442, such that the data or images may be remotely processed by a networked workstation 442.

The present disclosure has described one or more preferred embodiments, and it should be appreciated that many equivalents, alternatives, variations, and modifications, aside from those expressly stated, are possible and within the scope of the invention.

The invention claimed is:

1. A method for imaging a subject using a magnetic resonance imaging (MRI) system, the method comprising:
   (a) performing a pulse sequence with the MRI system, wherein the pulse sequence includes in each repetition time (TR) period:
      a first radio frequency (RF) excitation pulse that excites spins in a first slice;
      a first set of spatial encoding gradients to provide slice encoding and phase encoding of the spins in the first slice oriented in a first imaging plane;
      a second RF excitation pulse that excites spins in a second slice that is oriented in a second imaging plane that is non-orthogonal and non-parallel to the first imaging plane;
      a second set of spatial encoding gradients to provide slice encoding and phase encoding of the spins in the second slice;
      a single frequency encoding gradient that forms a first echo signal at a first echo time and a second echo signal at a second echo time, wherein the first echo signal is associated with spins in the first slice and the second echo signal is associated with spins in the second slice;
   (b) acquiring first data from the first echo signal with the MRI system, the first data being associated with the first slice;
   (c) acquiring second data from the second echo signal with the MRI system, the second data being associated with the second slice;
   (d) reconstructing a first image from the first data and reconstructing a second image from the second data, wherein the first image depicts the first slice and the second image depicts the second slice; and
   (e) outputting the first and second image to a computer system for at least one of display or storage.

2. A method for imaging a subject using a magnetic resonance imaging (MRI) system, the method comprising:

(a) performing a pulse sequence with the MRI system, wherein the pulse sequence includes in each repetition time (TR) period:
  a plurality of radio frequency (RF) excitation pulses that each excite a different slice, such that a plurality of slices is excited in each TR period, wherein at least two of the plurality of slices are non-orthogonal and non-parallel to each other;
  a plurality of spatial encoding gradients to provide slice encoding and phase encoding of spins in each of the plurality of slices;
  a single frequency encoding gradient that forms a plurality of echo signals at a corresponding plurality of echo times, wherein each of the plurality of echo signals is associated with the spins in a corresponding one of the plurality of slices;
(b) acquiring data from the plurality of echo signals with the MRI system;
(c) reconstructing a plurality of images from the data, wherein the plurality of images depict the plurality of slices; and
(d) outputting the plurality of images to a computer system for at least one of display or storage.

3. The method as recited in claim 1, wherein the first set of spatial encoding gradients and the second set of spatial encoding gradients each have a zeroth moment defined in part by a phase encoding step and a zeroth moment of the frequency encoding gradient.

4. The method as recited in claim 1, wherein the pulse sequence further comprises in each TR period a set of spoiler gradients applied after the frequency encoding gradient.

5. The method as recited in claim 1, wherein the first echo occurs before the second echo.

6. The method as recited in claim 1, wherein the first echo occurs after the second echo.

7. The method as recited in claim 1, wherein the first echo time and the second echo time are equal.

8. The method as recited in claim 1, wherein the first echo time and the second echo time are not equal.

9. The method as recited in claim 1, wherein the pulse sequence further comprises:
  a third RF excitation pulse that excites spins in a third slice that is oriented in a third imaging plane non-orthogonal and non-parallel with at least one of the first imaging plane or the second imaging plane;
  a third set of spatial encoding gradients to provide slice encoding and phase encoding of the spins in the third slice;
  wherein the single frequency encoding gradient also forms a third echo signal at a third echo time, the third echo signal being associated with the spins in the third slice; and
  further comprising acquiring third data from the third echo signal with the MRI system, the third data being associated with the third slice.

10. The method as recited in claim 1, wherein the first data and the second data are acquired using an extended readout gradient.

11. The method as recited in claim 1, wherein the first data and the second data are acquired using the frequency encoding gradient to form the first echo signal and the second echo signal as combined echo signals.

12. The method as recited in claim 3, wherein the zeroth moment of the first set of spatial encoding gradients is also defined in part by a zeroth moment of a slice-select gradient.

13. The method as recited in claim 10, wherein the first data and the second data are acquired using simultaneous image refocusing.

14. The method as recited in claim 12, wherein the zeroth moment of the first set of spatial encoding gradients is defined by, $$E_{n,\ell} = \begin{bmatrix} \ell \Delta k_P / \gamma \\ M_{0,n,F} \\ 0 \end{bmatrix};$$

wherein $\eta$ is a slice number index, $\ell$ is a phase encoding line index, $\Delta k_p$ is a phase encoding step size, $\gamma$ is a gyromagnetic ratio, and $M_{0,n,F}$ is the zeroth moment of the frequency encoding gradient.

* * * * *